US008051862B2

United States Patent
Ito et al.

(10) Patent No.: US 8,051,862 B2
(45) Date of Patent: Nov. 8, 2011

(54) LIQUID PROCESSING APPARATUS AND LIQUID PROCESSING METHOD

(75) Inventors: Norihiro Ito, Koshi (JP); Satoshi Kaneko, Koshi (JP); Hiromitsu Nanba, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 777 days.

(21) Appl. No.: 11/991,845

(22) PCT Filed: Jul. 20, 2007

(86) PCT No.: PCT/JP2007/064361
§ 371 (c)(1),
(2), (4) Date: Mar. 12, 2008

(87) PCT Pub. No.: WO2008/013118
PCT Pub. Date: Jan. 31, 2008

(65) Prior Publication Data
US 2010/0144158 A1    Jun. 10, 2010

(30) Foreign Application Priority Data
Jul. 26, 2006    (JP) .................................. 2006-203979

(51) Int. Cl.
*B08B 3/00*    (2006.01)
(52) U.S. Cl. ........................ 134/94.1; 134/137; 134/157
(58) Field of Classification Search .................. None
See application file for complete search history.

(56) References Cited

U.S. PATENT DOCUMENTS

| | | | |
|---|---|---|---|
| 2004/0226582 A1* | 11/2004 | Satoshi et al. | 134/25.4 |
| 2008/0173333 A1* | 7/2008 | Nanba et al. | 134/30 |
| 2010/0212701 A1* | 8/2010 | Nanba et al. | 134/95.1 |

FOREIGN PATENT DOCUMENTS

| | | |
|---|---|---|
| JP | 8-1064 | 1/1996 |
| JP | 9-232276 | 9/1997 |
| JP | 2002-170804 | 6/2002 |
| JP | 2004-281641 | 10/2004 |
| JP | 2005-259950 | 9/2005 |
| JP | 2005-286221 | 10/2005 |

OTHER PUBLICATIONS

JPO machine translation of Chinju (JP 2004281641), retrieved Jan. 25, 2011.*
JPO machine translation of Kiyose (JP 20021708041), retrieved Jan. 25, 2011.*
Japanese Office Action mailed on Apr. 20, 2010 for Japanese Application No. 2008-504564 w/ English translation.

* cited by examiner

*Primary Examiner* — Michael Kornakov
*Assistant Examiner* — Eric Golightly
(74) *Attorney, Agent, or Firm* — Smith, Gambrell & Russell, LLP

(57) ABSTRACT

A liquid treatment device having a rotatable substrate holding section (2) for horizontally holding a wafer (W), an annular-shaped rotation cup (4) which surrounds the wafer (W) which rotates with the wafer (W), a rotation mechanism (3) for integrally rotating the rotation cup (4) and the substrate holding section (2), a nozzle (5) for supplying a treatment liquid for the wafer (W) at a treatment position and a cleaning liquid for the rotation cup (4) at its external surface, a liquid supply section (85) for the nozzle (5), and a nozzle movement mechanism for moving the nozzle (5) between the wafer treatment position and the external portion of the rotation cup (4).

10 Claims, 6 Drawing Sheets

LIQUID PROCESSING APPARATUS AND LIQUID PROCESSING METHOD

TECHNICAL FIELD

The present invention relates to a liquid processing apparatus and liquid processing method for performing a predetermined liquid process on a substrate, such as a semiconductor wafer.

BACKGROUND ART

In the process of manufacturing semiconductor devices or flat panel display devices (FPD), liquid processes are frequently used, in which a process liquid is supplied onto a target substrate, such as a semiconductor wafer or glass substrate. For example, processes of this kind encompass a cleaning process for removing particles and/or contaminants deposited on a substrate, and a coating process for applying a photo-resist liquid or development liquid in a photolithography sequence.

As a liquid processing apparatus used for this purpose, the following apparatus of the single-substrate processing type is known. Specifically, a substrate, such as a semiconductor wafer, is held on a spin chuck, and a process liquid is supplied onto the front surface or front and back surfaces of the wafer, while the wafer is rotated. Consequently, a liquid film is formed on the front surface or front and back surfaces of the wafer, thereby performing a process.

In general, an apparatus of this kind is arranged to supply a process liquid onto the center of a wafer, and rotate the wafer to spread the process liquid outward, thereby forming a liquid film and throwing off the process liquid. A surrounding member, such as a cup, is disposed around the wafer to guide downward the process liquid thrown off from the wafer, so that the process liquid is swiftly drained. However, where such a cup or the like is used, part of the process liquid may bounce back to the wafer as mist, and generate defects thereon, such as water marks and/or particles.

As a technique for preventing this problem, Jpn. Pat. Appln. KOKAI Publication No. 8-1064 discloses a technique which utilizes a process liquid receiving member to be rotated integrally with rotary support means that rotates along with a substrate held thereon in a horizontal state. The process liquid receiving member receives a process liquid scattered around the substrate, and guides the process liquid outward to collect it. According to this Jpn. Pat. Appln. KOKAI Publication No. 8-1064, the process liquid receiving member includes a horizontal eaves portion, an inclined guide portion for guiding the process liquid outward and downward, a horizontal guide portion for guiding the process liquid outward in the horizontal direction, and a wall portion extending upward in the vertical direction, in this order from the substrate side. With this arrangement, the process liquid is guided into a narrow space to prevent mist from bouncing back onto the substrate, while the process liquid is drained from a drain port formed at a corner of the process receiving member. The process liquid is then discharged through grooves extending outward within a spacer disposed around the process liquid receiving member.

Where a liquid process of this kind is performed, a process liquid is deposited on the process liquid receiving member. In this sate, if the liquid process is performed on a substrate, the deposited process liquid may generate particles, which are then transferred onto the substrate. In order to solve this problem by a simple mechanism, a technique of supplying a cleaning liquid from a nozzle disposed inside a cup for receiving a process liquid (for example, Jpn. Pat. Appln. KOKAI Publication No. 9-232276) may be usable.

However, the process liquid receiving member disclosed in Jpn. Pat. Appln. KOKAI Publication No. 8-1064 is arranged to rotate along with a substrate at a high speed, so the process liquid reaches portions not only inside but also outside the process liquid receiving member. Accordingly, the technique disclosed in Jpn. Pat. Appln. KOKAI Publication No. 9-232276 is unsuitable for the structure disclosed in Jpn. Pat. Appln. KOKAI Publication No. 8-1064.

DISCLOSURE OF INVENTION

An object of the present invention is to provide a liquid processing apparatus and liquid processing method that allow a rotary cup to be sufficiently cleaned, wherein the rotary cup is configured to rotate along with a substrate and to receive a process liquid.

Another object of the present invention is to provide a storage medium that stores a program for executing the liquid processing method.

According to a first aspect of the present invention, there is provided a liquid processing apparatus comprising: a substrate holding member configured to rotate along with a substrate held thereon in a horizontal state; a rotary cup configured to surround the substrate held on the substrate holding member and to rotate along with the substrate; a rotation mechanism configured to integrally rotate the rotary cup and the substrate holding member; a liquid supply mechanism configured to supply a process liquid onto the substrate; and a cleaning liquid supply mechanism configured to supply a cleaning liquid onto an outer surface of the rotary cup.

According to a second aspect of the present invention, there is provided a liquid processing apparatus comprising: a substrate holding member configured to rotate along with a substrate held thereon in a horizontal state; a rotary cup configured to surround the substrate held on the substrate holding member and to rotate along with the substrate; a rotation mechanism configured to integrally rotate the rotary cup and the substrate holding member; a liquid delivery nozzle configured to deliver a process liquid for performing a liquid process on the substrate and a cleaning liquid; a liquid supply section configured to supply the process liquid and the cleaning liquid to the liquid delivery nozzle; and a nozzle transfer mechanism configured to transfer the liquid delivery nozzle between a first position for delivering a liquid onto the substrate and a second position for delivering a liquid onto an outer surface of the rotary cup, wherein the liquid process is performed on the substrate by delivering the process liquid onto the substrate from the liquid delivery nozzle set at a position corresponding to the substrate, and cleaning is performed on the rotary cup by delivering the cleaning liquid onto the outer surface of the rotary cup from the liquid delivery nozzle set at a position corresponding to the rotary cup.

In the first aspect, the process liquid supply mechanism may be configured to also serve as the cleaning liquid supply mechanism.

In the second aspect, the apparatus may further comprise a control section preset to control the liquid supply section and the nozzle transfer mechanism such that the liquid process is performed on the substrate by delivering the process liquid onto the substrate from the liquid delivery nozzle set at a position corresponding to the substrate, and cleaning is performed on the rotary cup by delivering the cleaning liquid onto the outer surface of the rotary cup from the liquid delivery nozzle set at a position corresponding to the rotary cup.

In the first or second aspect, the apparatus may further comprise a drain cup disposed around the rotary cup to receive the process liquid discharged from the rotary cup and including a drain port configured to drain the process liquid thus received. The apparatus may further comprise an exhaust cup disposed around the drain cup to mainly collect a gas component from inside and around the rotary cup. The rotary cup may include an eaves portion configured to cover an area above an end of the substrate held on the substrate holding member, and an outer wall portion connected to the eaves portion to surround the substrate, and the cleaning liquid may be supplied onto an upper surface of the eaves portion.

According to a third aspect of the present invention, there is provided a liquid processing method for performing a liquid process on a substrate in a liquid processing apparatus that comprises a substrate holding member configured to rotate along with a substrate held thereon in a horizontal state, a rotary cup configured to surround the substrate held on the substrate holding member and to rotate along with the substrate, a rotation mechanism configured to integrally rotate the rotary cup and the substrate holding member, and a liquid delivery nozzle configured to deliver a process liquid for performing the liquid process on the substrate and a cleaning liquid, the method comprising: performing the liquid process on the substrate by delivering the process liquid onto the substrate from the liquid delivery nozzle set at a position corresponding to the substrate; and performing cleaning on the rotary cup by delivering the cleaning liquid onto an outer surface of the rotary cup from the liquid delivery nozzle set at a position corresponding to the rotary cup.

According to a fourth aspect of the present invention, there is provided a storage medium that stores a program for execution on a computer, which is used for a liquid processing apparatus that comprises a substrate holding member configured to rotate along with a substrate held thereon in a horizontal state, a rotary cup configured to surround the substrate held on the substrate holding member and to rotate along with the substrate, a rotation mechanism configured to integrally rotate the rotary cup and the substrate holding member, and a liquid delivery nozzle configured to deliver a process liquid for performing a liquid process on the substrate and a cleaning liquid, wherein the program, when executed, causes the computer to control liquid processing apparatus to conduct a liquid processing method comprising: performing the liquid process on the substrate by delivering the process liquid onto the substrate from the liquid delivery nozzle set at a position corresponding to the substrate; and performing cleaning on the rotary cup by delivering the cleaning liquid onto an outer surface of the rotary cup from the liquid delivery nozzle set at a position corresponding to the rotary cup.

According to the present invention, the apparatus includes a process liquid supply mechanism configured to supply a process liquid onto the substrate, and a cleaning liquid supply mechanism configured to supply a cleaning liquid onto an outer surface of the rotary cup. In this case, it is possible to sufficiently clean the process liquid deposited on the outer surface of the rotary cup, which is configured to rotate along with the substrate and to receive the process liquid, thereby effectively preventing particles from being deposited on the substrate.

Further, a liquid process is performed on the substrate by delivering the process liquid onto the substrate from the liquid delivery nozzle set at a position corresponding to the substrate, and cleaning is performed on the rotary cup by delivering the cleaning liquid onto the outer surface of the rotary cup from the liquid delivery nozzle set at a position corresponding to the rotary cup. In this case, it is possible to sufficiently clean the outer surface of the rotary cup by a simple mechanism, without requiring any additional nozzle, thereby effectively preventing particles from being deposited on the substrate.

BEST MODE FOR CARRYING OUT THE INVENTION

An embodiment of the present invention will now be described with reference to the accompanying drawings. Hereinafter, an explanation will be given of a case where the present invention is applied to a liquid processing apparatus that can perform a cleaning process on the front and back surfaces of a semiconductor wafer (which will be simply referred to as "wafer", hereinafter).

Figure 1:
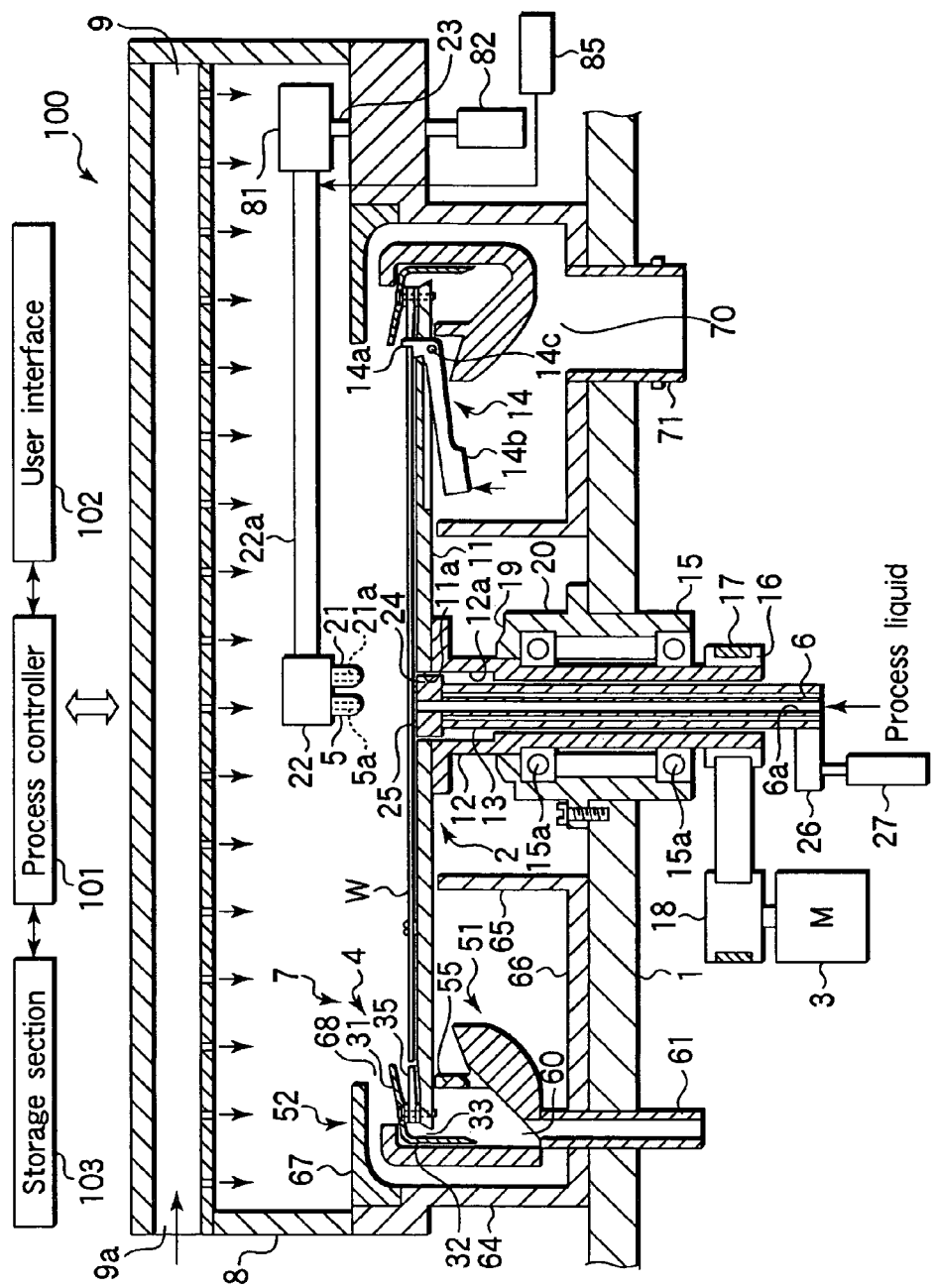
[FIG. 1] This is a sectional view schematically showing the structure of a liquid processing apparatus according to an embodiment of the present invention.
Figure 2:
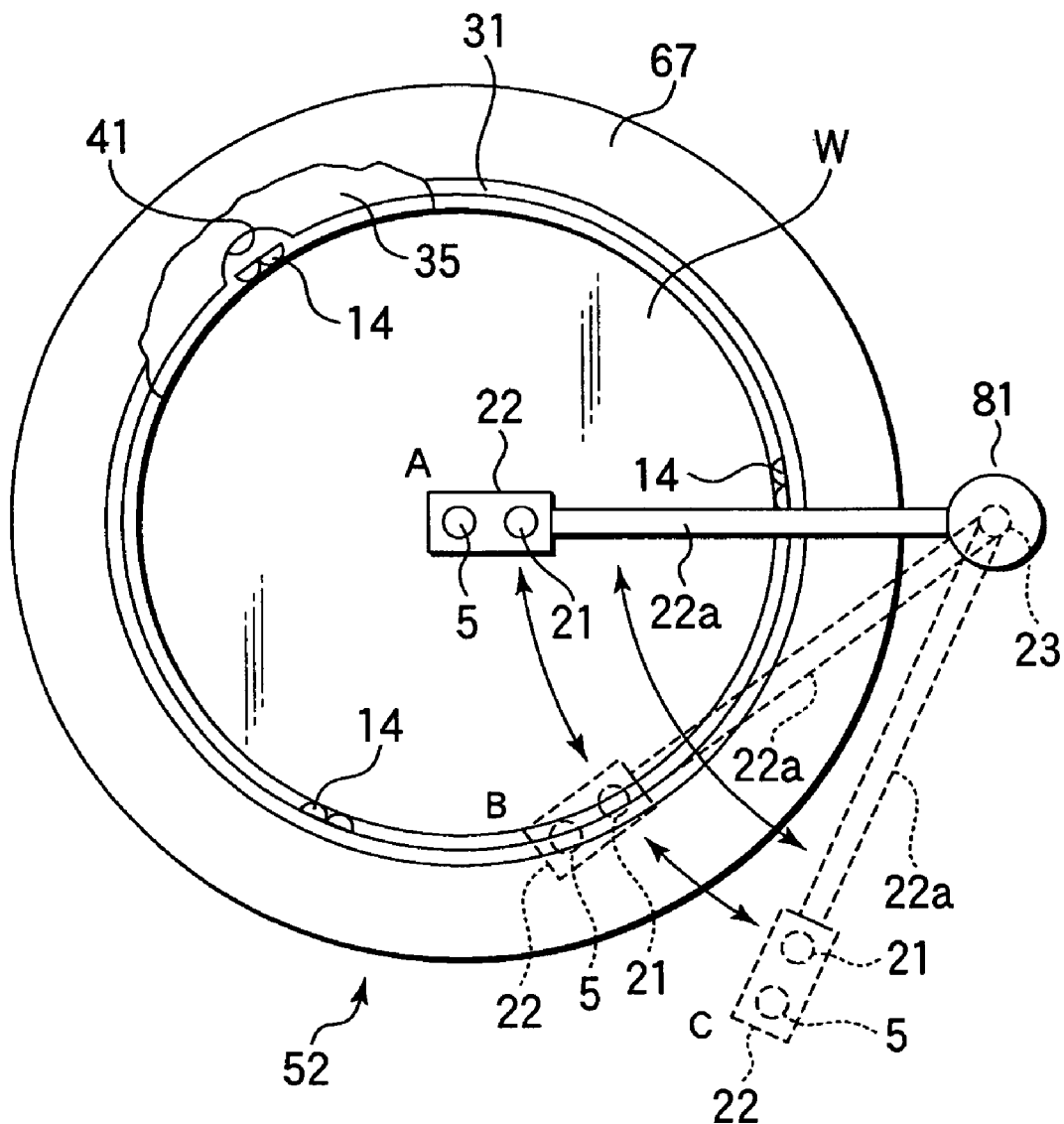
[FIG. 2] This is a partially sectional plan view schematically showing the liquid processing apparatus according to the embodiment of the present invention.
Figure 3:
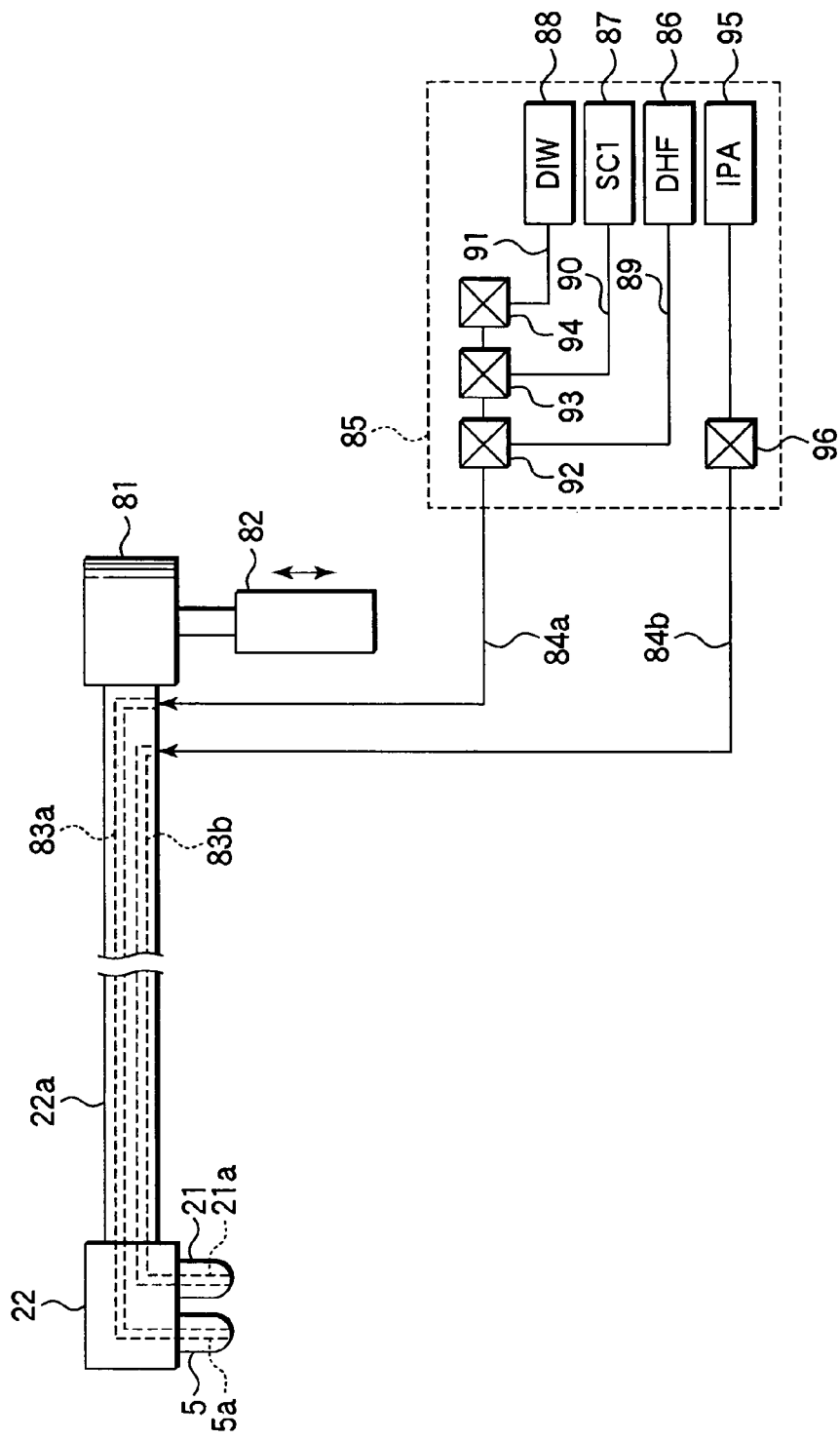
[FIG. 3] This is a view schematically showing a process liquid supply mechanism used in the liquid processing apparatus shown in FIG. 1.
Figure 4:
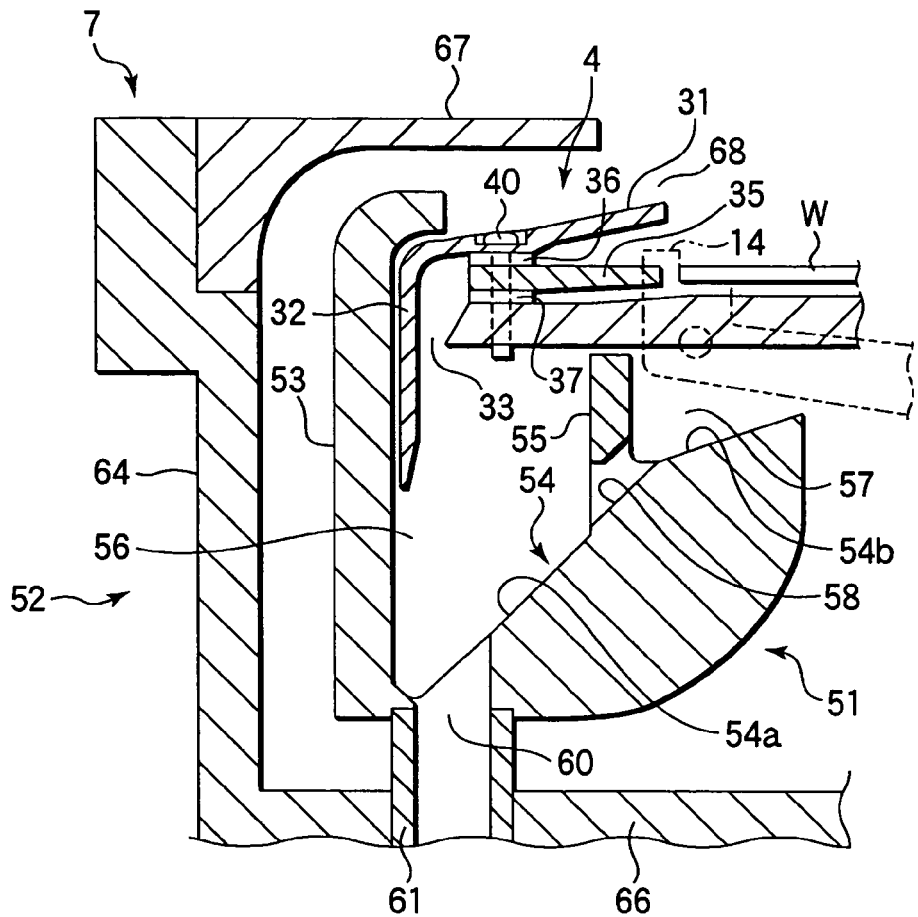
[FIG. 4] This is an enlarged sectional view showing an exhaust/drain section used in the liquid processing apparatus shown in FIG. 1.

FIG. 1 is a sectional view schematically showing the structure of a liquid processing apparatus according to an embodiment of the present invention. FIG. 2 is a plan view of the liquid processing apparatus shown in FIG. 1. FIG. 3 is a view schematically showing a process liquid supply mechanism used in the liquid processing apparatus shown in FIG. 1. FIG. 4 is an enlarged sectional view showing an exhaust/drain section used in the liquid processing apparatus shown in FIG. 1. A plurality of liquid processing apparatuses 100 are disposed in a liquid processing system (not shown). Each liquid processing apparatus 100 includes a base plate 1 and a wafer holding member 2 for rotatably holding a target substrate or wafer W. The wafer holding member 2 is rotatable by a rotary motor 3. A rotary cup 4 is disposed to surround the wafer W held on the wafer holding member 2 and to rotate along with the wafer holding member 2. The liquid processing apparatus 100 further includes a front surface process liquid supply nozzle 5 for supplying a process liquid onto the front surface of the wafer W, and a back surface process liquid supply nozzle 6 for supplying a process liquid onto the back surface of the wafer W. Further, an exhaust/drain section 7 is disposed around the rotary cup 4. A casing 8 is disposed to cover the area around the exhaust/drain section 7 and the area above the wafer W. The casing 8 is provided with a gas flow inlet section 9 at the top arranged to receive, through an inlet port 9a formed on a lateral side, a gas flow supplied from a fan/filter unit (FFU) 9 of the liquid processing system, so that clean air is supplied as a down flow onto the wafer W held on the wafer holding member 2.

The wafer holding member 2 includes a rotary plate 11 formed of a circular plate set in a horizontal state. The center of the bottom of the rotary plate 11 is connected to a cylindrical rotary shaft 12 extending vertically downward. The rotary plate 11 has a circular opening 11a at the center, which communicates with a bore 12a formed inside the rotary shaft 12. An elevating member 13 supporting the back surface process liquid supply nozzle 6 is movable up and down through the bore 12a and opening 11a. As shown in FIG. 2, the rotary plate 11 is provided with three holding accessories 14 disposed at regular intervals for holding the outer edge of the wafer W. The holding accessories 14 are configured to hold the wafer W in a horizontal state such that the wafer W is slightly separated from the rotary plate 11. Each of the holding accessories 14 includes a holding portion 14a configured to hold the edge of the wafer W, an operation lever 14b extending from the holding portion 14a toward the center of the lower surface of the rotary plate, and a pivot shaft 14c that supports the holding portion 14a to be vertically rotatable. When the distal end of the operation lever 14b is pushed up by a cylinder mechanism (not shown), the holding portion 14a is rotated outward and cancels the hold on the wafer W. Each holding accessory 14 is biased by a spring (not shown) toward a direction for the holding portion 14a to hold the wafer W, so that the holding accessory 14 can hold the wafer W when the cylinder mechanism does not act thereon.

The rotary shaft 12 is rotatably supported by the base plate 1 through a bearing mechanism 15 having two bearings 15a. The rotary shaft 12 is provided with a pulley 16 fitted thereon at the lower end, and the shaft of the motor 3 is also provided with a pulley 18 fitted thereon, while a belt 17 is wound around between these pulleys 16 and 18. The rotary shaft 12 is rotated through the pulley 18, belt 17, and pulley 16 by rotation of the motor 3.

The front surface process liquid supply nozzle 5 is attached to a nozzle holding member 22 supported on the distal end of a nozzle arm 22a. A process liquid or the like is supplied from a process liquid supply mechanism 85 described later through a flow passage formed in the nozzle arm 22a, and is then delivered from a nozzle hole 5a formed in the nozzle 5. For example, the process liquid thus delivered encompasses a chemical liquid for wafer cleaning, a rising liquid such as purified water, and so forth. The nozzle holding member 22 is further provided with a drying solvent nozzle 21 attached thereon for delivering a drying solvent, such as IPA. A drying solvent, such as IPA, is delivered from a nozzle hole 21a formed in the nozzle 21. The rising liquid, such as purified water, supplied from the process liquid supply mechanism 85 is also used for cleaning of the outer surface of the rotary cup 4, as described later.

As shown in FIG. 2, the nozzle arm 22a is rotatable by a driving mechanism 81 about a shaft 23 used as a central axis to move the front surface process liquid supply nozzle 5 between three positions. These three positions are a wafer cleaning position A above the wafer W between the center and periphery thereof, a cup cleaning position B above the rotary cup 4, and a retreat position C outside the wafer W. At the wafer cleaning position A, the nozzle arm 22a is used to supply a predetermined process liquid onto a predetermined position of the wafer W to perform a cleaning process on the wafer W. At the cup cleaning position B, the nozzle arm 22a is used to perform a cleaning process mainly on the outer surface of the rotary cup 4. Further, the nozzle arm 22a is movable up and down by an elevating mechanism 82, such as a cylinder mechanism.

As shown in FIG. 3, the nozzle arm 22a has a flow passage 83a formed therein and connected at one end to the nozzle hole 5a of the front surface process liquid supply nozzle 5. The other end of the flow passage 83a is connected to a tube 84a. The nozzle arm 22a further has a flow passage 83b formed therein and connected at one end to the nozzle hole 21a of the drying solvent nozzle 21. The other end of the flow passage 83b is connected to a tube 84b. Predetermined process liquids are supplied through the tubes 84a and 84b from the process liquid supply mechanism 85. The process liquid supply mechanism 85 includes cleaning chemical liquid sources, such as a DHF supply source 86 for supplying dilute hydrofluoric acid (DHF) as an acidic chemical liquid and an SC1 supply source 87 for supplying ammonia hydrogen peroxide solution (SC1) as an alkaline chemical liquid. The process liquid supply mechanism 85 further includes a rinsing liquid source, such as a DIW supply source 88 for supplying purified water (DIW) and a drying solvent source, such as an IPA supply source 95 for supplying IPA. The DHF supply source 86, SC1 supply source 87, and DIW supply source 88 are connected to tubes 89, 90, and 91 extending therefrom. The tubes 89, 90, and 91 are connected to the tube 84a through switching valves 92, 93, and 94. Accordingly, ammonia hydrogen peroxide solution (SC1), dilute hydrofluoric acid (DHF), and purified water (DIW) are selectively supplied to the front surface process liquid supply nozzle 5 by operating the switching valves 92, 93, and 94. In this case, the tube 91 extending from the DIW supply source 88 is connected to the most upstream side of the tube 84a. On the other hand, the IPA supply source 95 is directly connected to the tube 84b extending from the flow passage 83b and provided with a switching valve 96 thereon. Accordingly, IPA is supplied to the drying solvent nozzle 21 by opening the switching valve 96. As described above, purified water (DIW) uses as a rising liquid is also used for cleaning of the rotary cup 4, so the process liquid supply mechanism 85 serves as a cleaning liquid supply mechanism for the rotary cup 4, as well.

The back surface process liquid supply nozzle 6 has a nozzle hole 6a formed through the center of the elevating member 13 and extending in the longitudinal direction. A predetermined process liquid is supplied from a process liquid supply mechanism (not shown) into the nozzle hole 6a from below and is then delivered from the nozzle hole 6a onto the back surface of the wafer. W. For example, the process liquid thus delivered encompasses a cleaning chemical liquid, a rising liquid such as purified water, and so forth, as in the front surface process liquid supply nozzle 5. The process liquid supply mechanism for supplying a process liquid into the back surface process liquid supply nozzle 6 may be structured almost the same as the process liquid supply mechanism 85 except for the IPA supply circuit. The elevating member 13 includes a wafer support head 24 at the top for supporting the wafer W. The wafer support head 24 is provided with three wafer support pins 25 for supporting the wafer W (only two of them are shown) on the upper surface. The lower end of the back surface process liquid supply nozzle 6 is connected to a cylinder mechanism 27 through a connector 26. The elevating member 13 is movable up and down by the cylinder mechanism 27 to move up and down the wafer W for loading and unloading the wafer W.

As shown in FIG. 4, the rotary cup 4 includes an annular eaves portion 31 inclined to extend inward and upward from a position above the end of the rotary plate 11 and a cylindrical outer wall portion 32 extending vertically downward from the outer end of the eaves portion 31. An annular gap 33 is formed between the outer wall portion 32 and rotary plate 11, so that a process liquid (mist) scattered by rotation of the wafer W along with the rotary plate 11 and rotary cup 4 is guided downward through the gap 33.

Figure 5:
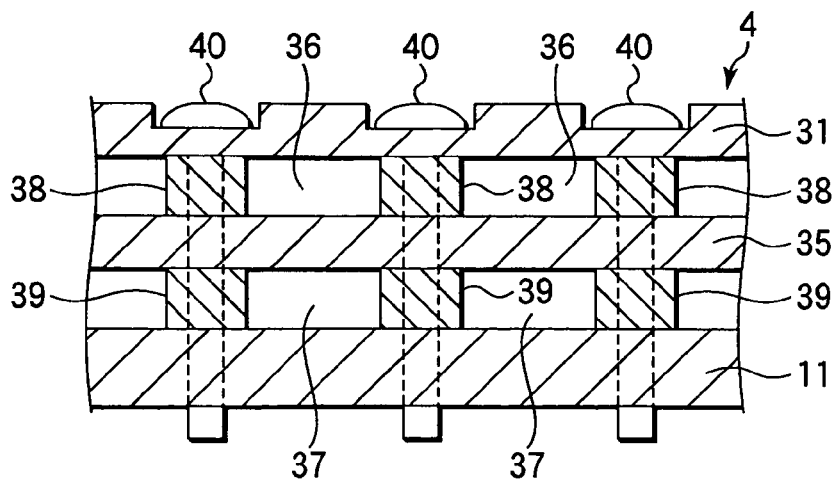
[FIG. 5] This is a view for explaining the attached state of a rotary cup and a guide member used in the liquid processing apparatus shown in FIG. 1.

A plate-like guide member 35 is disposed between the eaves portion 31 and rotary plate 11 at a height essentially the same as the wafer W. As shown in FIG. 5, a plurality of spacers 38 and 39 are disposed in an annular direction between the eaves portion 31 and guide member 35 and between the guide member 35 and rotary plate 11 to form openings 36 and 37 for allowing the process liquid to pass therethrough. The eaves portion 31, guide member 35, rotary plate 11, and spacers 38 and 39 are fixed to each other by screws 40.

The guide member 35 is arranged such that the upper and lower surfaces thereof are to be almost continued to the front and back surfaces of the wafer W. When a process liquid is supplied onto the center of the front surface of the wafer W from the front surface process liquid supply nozzle 5 while the wafer holding member 2 and rotary cup 4 are rotated along with the wafer W by the motor 3, the process liquid is spread by a centrifugal force on the front surface of the wafer W and is thrown off from the peripheral edge of the wafer W. The process liquid thus thrown off from the front surface of the wafer W is guided by the upper surface of the guide member 35 almost continued thereto. Then, the process liquid is discharged outward through the openings 36, and is guided downward by the eaves portion 31 and outer wall portion 32. Similarly, when a process liquid is supplied onto the center of the back surface of the wafer W from the back surface process liquid supply nozzle 6 while the wafer holding member 2 and rotary cup 4 are rotated along with the wafer W, the process liquid is spread by a centrifugal force on the back surface of the wafer W and is thrown off from the peripheral edge of the wafer W. The process liquid thus thrown off from the back surface of the wafer W is guided by the lower surface of the guide member 35 almost continued thereto. Then, the process liquid is discharged outward through the openings 37, and is guided downward by the eaves portion 31 and outer wall portion 32. At this time, since a centrifugal force acts on the process liquid guided to the spacers 38 and 39 and outer wall portion 32, mist of the process liquid is inhibited from returning inward.

Further, since the process liquid thrown off from the front and back surfaces of the wafer W is guided by the guide member 35, the process liquid separated from the peripheral edge of the wafer W can hardly become turbulent. In this case, it is possible to guide the process liquid out of the rotary cup 4 while preventing the process liquid from being turned into mist. As shown in FIG. 2, the guide member 35 has notches 41 at positions corresponding to the wafer holding accessories 14 to accept the wafer holding accessories 14.

The exhaust/drain section 7 is mainly used for collecting exhaust gas and drainage discharged from the space surrounded by the rotary plate 11 and rotary cup 4. As shown in the enlarged view of FIG. 4, the exhaust/drain section 7 includes an annular drain cup 51 disposed to receive the process liquid discharged from the rotary cup 4, and an annular exhaust cup 52 disposed outside the drain cup 51 to surround the drain cup 51.

As shown in FIGS. 1 and 4, the drain cup 51 includes a vertical wall 53 disposed outside the rotary cup 4 very closely to the outer wall portion 32, and a bottom portion 54 extending inward from the lower end of the vertical wall 53. The upper side of the vertical wall 53 extends to a position above the outer wall portion 32 of the rotary cup 4 and is curved along the eaves portion 31. This arrangement is conceived to prevent mist from flowing backward from inside the drain cup 51 toward the wafer W. The drain cup 51 further includes an annular partition wall 55 disposed therein in an annular direction outside the holding accessories 14 and extending from the bottom portion 54 to a position near the lower surface of the rotary plate 11. The interior of the drain cup 51 is divided by the partition wall 55 into a main cup portion 56 and an auxiliary cup portion 57. The main cup portion 56 is used to receive the process liquid discharged from the gap 33, while the auxiliary cup portion 57 is used to receive the process liquid dropping from portions near the holding portions 14a of the holding accessories 14. The bottom portion 54 is divided by the partition wall 55 into a first portion 54a corresponding to the main cup portion 56 and a second portion 54b corresponding to the auxiliary cup portion 57. The first and second portions 54a and 54b are inclined upward and inward (toward the rotational center). The inner side of the second portion 54b extends inward (toward the rotational center) further from a position corresponding to the holding portions 14a of the holding accessories 14. The partition wall 55 serves to prevent a gas flow formed by the portions of the holding accessories 14 protruding downward below the rotary plate 11 from involving and transferring mist onto wafer W, when the rotary plate 11 is rotated. The partition wall 55 has a hole 58 formed therein to guide the process liquid from the auxiliary cup portion 57 to the main cup portion 56.

The drain cup 51 has a drain port 60 formed in the bottom portion 54 at one position on the outermost side and connected to a drain tube 61. The drain tube 61 is connected to a drain-switching member (not shown), so that process liquids are separately collected or discarded in accordance with the types thereof. In place of a single drain port 60, a plurality of drain ports 60 may be formed.

The exhaust cup 52 includes an outer wall 64 vertically extending outside the vertical wall 53 of the drain cup 51, and an inner wall 65 disposed on the inward side from the holding accessories 14 and vertically extending to have an upper end adjacent to the rotary plate 11. The exhaust cup 52 further includes a bottom wall 66 placed on the base plate 1, and an upper wall 67 extending upward and curved from the outer wall 64 to cover an area above the rotary cup 4. The exhaust cup 52 is mainly used for collecting and exhausting gas components from inside and around the rotary cup 4 through an annular inlet port 68 formed between the upper wall 67 and eaves portion 31 of the rotary cup 4. As shown in FIG. 1, the exhaust cup 52 has exhaust ports 70 formed in the bottom and each connected to an exhaust tube 71. The exhaust tube 71 is connected to a suction mechanism (not shown) on the downstream side, so that gas is exhausted from around the rotary cup 4. The plurality of exhaust ports 70 can be selectively used by switching in accordance with the types of process liquids.

As described above, the process liquid is guided by the rotary cup 4 to the drain cup 51, and gas components are guided from the inlet port 68 to the exhaust cup 52. In this case, the liquid-draining from the drain cup 51 is performed independently of the gas-exhausting from the exhaust cup 52, so that drainage and exhaust gas are guided separately from each other. Further, since the exhaust cup 52 is disposed to surround the drain cup 51, mist leaked out of the drain cup 51 is swiftly discharged from the exhaust port 70, so that the mist is reliably prevented from diffusing outside.

The liquid processing apparatus 100 includes a process controller 101 comprising a computer, which is connected to and controls the respective components in the liquid processing apparatus 100. The process controller 101 is connected to the user interface 102, which includes, e.g., a keyboard and a display, wherein the keyboard is used for a process operator to input commands for operating the respective components in the liquid processing apparatus 100, and the display is used for showing visualized images of the operational status of the respective components in the liquid processing apparatus 100. Further, the process controller 101 is connected to a storage section 103 that stores recipes or control programs for the process controller 101 to control the liquid processing apparatus 100 so as to perform various processes, and control programs for the respective components of the liquid processing apparatus 100 to perform predetermined processes in accordance with process conditions. The recipes may be stored in a storage medium, such as a hard disk or semiconductor memory, or a storage medium of the portable type, such as a CDROM or DVD, to be set at a predetermined position. Alternatively, the recipes may be used online while they are transmitted from another apparatus through, e.g., a dedicated line, as needed. A required recipe is retrieved from the storage section 103 and executed by the process controller 101 in accordance with an instruction or the like input through the user interface 102. Consequently, the liquid processing apparatus 100 can perform a predetermined process under the control of the process controller 101. In this embodiment, particularly, the process controller 101 is arranged to control the driving mechanism 81 so as to change positions of the front surface process liquid supply nozzle 5, and to control switching of liquids from the process liquid supply mechanism 85, thereby selectively performing a cleaning process on the wafer W and a cleaning process on the outer surface of the rotary cup 4.

Figure 6A:
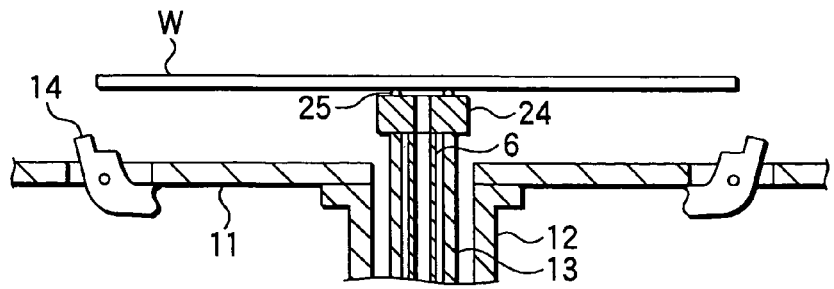
[FIG. 6A] This is a view for explaining a process operation of the liquid processing apparatus according to the embodiment of the present invention.
Figure 6B:
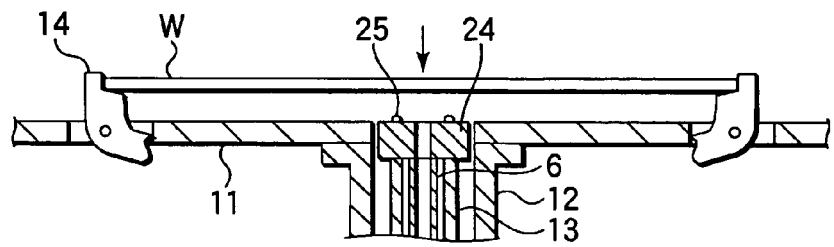
[FIG. 6B] This is a view for explaining a process operation of the liquid processing apparatus according to the embodiment of the present invention.
Figure 6C:
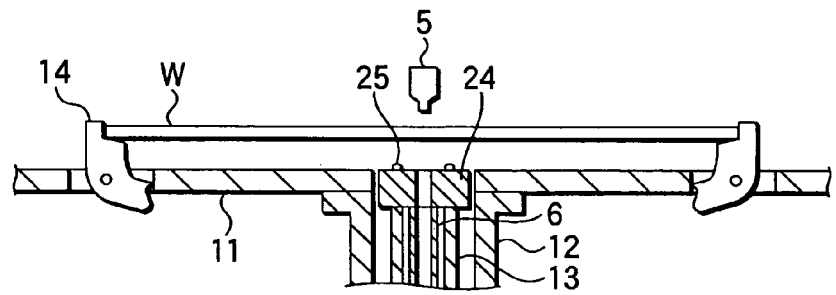
[FIG. 6C] This is a view for explaining a process operation of the liquid processing apparatus according to the embodiment of the present invention.

Next, an explanation will be given, with reference to FIGS. 6A to 6D, of an operation of the liquid processing apparatus 100 having the structure described above. At first, as shown in FIG. 6A, the elevating member 13 is set at the upper position, and a wafer W is transferred from a transfer arm (not shown) onto the support pins 25 of the wafer support head 24. Then, as shown in FIG. 6B, the elevating member 13 is moved down to a position where the wafer W can be held by the holding accessories 14, and then the wafer W is chucked by the holding accessories 14. Then, as shown in FIG. 6C, the front surface process liquid supply nozzle 5 is moved from the retreat position to the wafer cleaning position.

Figure 6D:
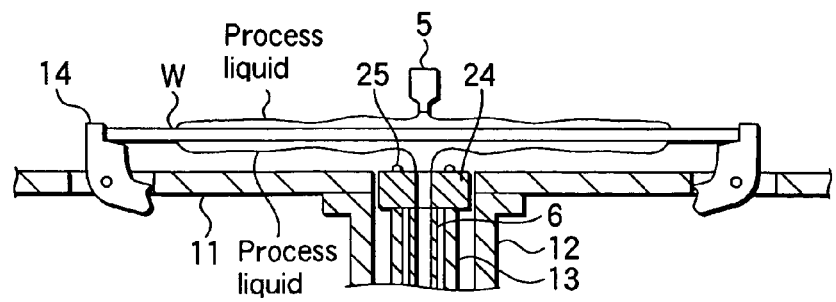
[FIG. 6D] This is a view for explaining a process operation of the liquid processing apparatus according to the embodiment of the present invention.

In this state, as shown in FIG. 6D, while the holding member 2 is rotated along with the rotary cup 4 and wafer W by the motor 3, a predetermined process liquid is supplied from the front surface process liquid supply nozzle 5 and back surface process liquid supply nozzle 6 to perform a cleaning process on the wafer W.

In this wafer cleaning process, the process liquid is supplied from the front surface process liquid supply nozzle 5 and back surface process liquid supply nozzle 6 onto the front surface and back surface of the wafer W, and is spread by a centrifugal force outward on the wafer W and thrown off from the peripheral edge of the wafer W.

The cup surrounding the wafer W used in this wafer cleaning process is the rotary cup 4 that is rotated along with the wafer W. Accordingly, when the process liquid thrown off from the wafer W hits against the rotary cup 4, a centrifugal force acts on the process liquid, and the process liquid is thereby inhibited from being scattered (turned into mist), unlike a case where a stationary cup is used for the same purpose. Then, the process liquid is guided downward by the rotary cup 4, and is discharged through the gap 33 into the main cup portion 56 of the drain cup 51. Further, since the rotary plate 11 has holes for inserting the holding portions 14a at positions where the holding accessories 14 are attached, the process liquid drops through the holes into the auxiliary cup portion 57 of the drain cup 51. The process liquid thus received by the drain cup 51 is discharged from the drain port 60 through the drain tube 61. Further, mainly gas components are collected from inside and around the rotary cup 4 into the exhaust cup 52 through the annular inlet port 68 formed between the upper wall 67 and the eaves portion 31 of the rotary cup 4, and are discharged from the exhaust ports 70 through the exhaust tubes 71.

When the cleaning process is performed on the wafer W, the process liquid is scattered. Consequently, a chemical liquid remains and/or a salt is precipitated on the outer surface of the rotary cup 4 as well as the inner surface thereof, particularly on the upper surface of the eaves portion 31. Such a remaining chemical liquid and/or precipitated salt may generate particles, which are then transferred onto the wafer W.

The inner surface of the rotary cup 4 is cleaned to some extent when a rising process is performed on the wafer W. On the other hand, the outer surface of the rotary cup 4, particularly the upper surface of the eaves portion 31, is not cleaned when a rising process is performed on the wafer W.

Figure 7:
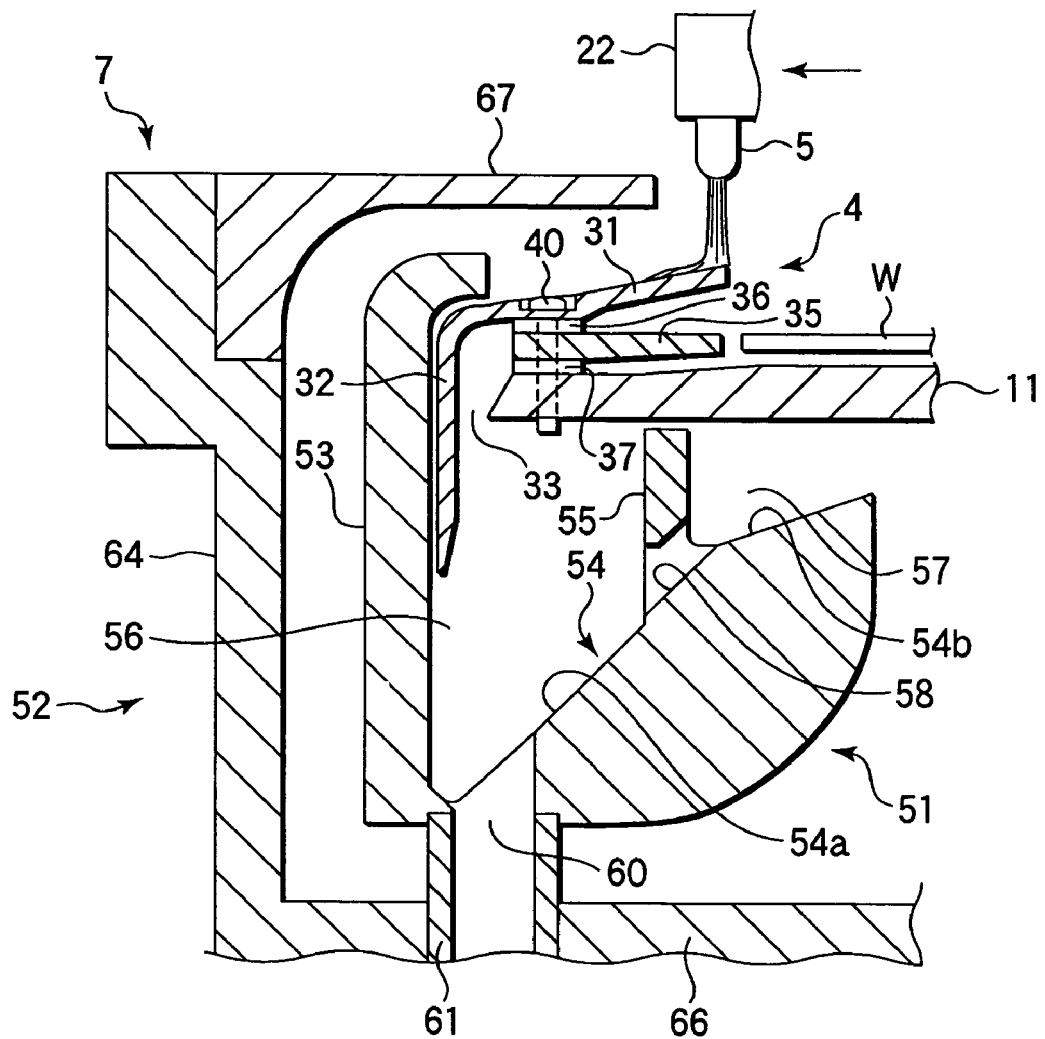
[FIG. 7] This is a view schematically showing a state where a front surface process liquid supply nozzle is placed at a cup cleaning position and cleaning of the rotary cup is performed in the liquid processing apparatus shown in FIG. 1.

According to this embodiment made in light of the problem described above, after the cleaning process on the wafer W is finished, the front surface process liquid supply nozzle 5 is moved in an over-scanning manner by the driving mechanism 81 to the cup cleaning position B (see FIG. 2) directly above the rotary cup 4, as shown in FIG. 7. Further, the liquid supplied from the process liquid supply mechanism 85 is switched to purified water (DIW), so that purified water (DIW) is supplied from the front surface process liquid supply nozzle 5 onto the outer surface of the rotary cup 4, specifically on the upper surface of the eaves portion 31, thereby performing a cleaning process.

Consequently, the chemical liquid and/or salt remaining on the outer surface of the rotary cup 4, particularly on the upper surface of the eaves portion 31, are very efficiently removed to effectively prevent particles from being deposited on the wafer W.

Further, as described above, after the cleaning process on the wafer W is finished, the front surface process liquid supply nozzle 5 used for the cleaning process on the wafer W is moved in an over-scanning manner to the cup cleaning position. Then, a cleaning liquid consisting of purified water (DIW) is supplied onto the outer surface of the rotary cup 4 to clean the outer surface of the rotary cup 4. In this case, the outer surface of the rotary cup 4 can be sufficiently cleaned by a simple mechanism, without requiring any additional nozzle for the rotary cup cleaning.

The cleaning on the rotary cup 4 is performed while the rotary cup 4 is rotated, as in the cleaning on the wafer W. However, the number of revolutions used for the cleaning on the rotary cup 4 is preferably set to be lower than that used for the cleaning on the wafer W. This is intended to suppress scattering of the cleaning liquid inside the exhaust cup 51. For example, the number of revolutions of rotary cup 4 (wafer W) used for the cleaning on the wafer W is set to be about 300 to 1,000 rpm, while the number of revolutions used for the cleaning on the rotary cup 4 is set to be about 100 to 300 rpm.

When the cleaning is performed on the outer surface of the rotary cup 4, the front surface process liquid supply nozzle 5 may be set at a position at the innermost side of the eaves portion 31. In this case, the cleaning liquid may flow on the inner surface of the eaves portion 31 as well as the outer surface thereof, so that the inner surface of the rotary cup 4 is more reliably cleaned.

The present invention is not limited to the embodiment described above, and it may be modified in various manners. For example, the embodiment described above is exemplified by a case where a mechanism for performing a cleaning process on a target substrate or wafer (the front surface process liquid supply nozzle 5 and process liquid supply mechanism 85) is used also as a mechanism for performing a cleaning process on the rotary cup. Alternatively, a mechanism for performing a cleaning process on the rotary cup may be disposed in addition to a mechanism for performing a cleaning process on a wafer. The embodiment described above is exemplified by a liquid processing apparatus for cleaning the front and back surfaces of a wafer. However, the present invention may be applied to a liquid processing apparatus for cleaning only on the front surface of a wafer. Further, in place of a cleaning process, the present invention may be applied to a liquid processing apparatus for performing another liquid process, such as a resist liquid coating process and/or a subsequent development process. In the embodiment described above, the target substrate is exemplified by a semiconductor wafer, but the present invention may be applied to another substrate, such as a substrate for flat panel display devices (FPD), a representative of which is a glass substrate for liquid crystal display devices (LCD).

INDUSTRIAL APPLICABILITY

The present invention is effectively applied to a cleaning apparatus for removing particles and/or contaminants deposited on a semiconductor wafer.

The invention claimed is:

1. A liquid processing apparatus comprising:
a substrate holding member configured to rotate along with a substrate held thereon in a horizontal state;
a rotary cup configured to surround the substrate held on the substrate holding member and to rotate along with the substrate;
a rotation mechanism configured to integrally rotate the rotary cup and the substrate holding member;
a process liquid supply mechanism configured to supply a process liquid onto an upper surface of the substrate;
a cleaning liquid supply mechanism configured to supply a cleaning liquid onto an outer surface of the rotary cup, the process liquid supply mechanism and the cleaning liquid solution mechanism sharing a liquid delivery nozzle configured to deliver the process liquid and the cleaning liquid and a supply section configured to supply the process liquid and the cleaning liquid to the liquid delivery nozzle;
a nozzle transfer mechanism configured to transfer the liquid delivery nozzle to place the liquid delivery nozzle at a first position above the substrate held on the substrate holding member and to place the liquid delivery nozzle at a second position above the outer surface of the rotary cup; and
a control section configured to control an operation of the apparatus,
wherein the control mechanism includes a non-transitory storage medium that stores a program, which, when executed, causes the control section to control the apparatus to conduct a sequence, the sequence including:
placing the liquid delivery nozzle at the first position and delivering the process liquid onto the upper surface of the substrate from the liquid delivery nozzle at the first position to perform a liquid process on the substrate, and
placing the liquid delivery nozzle at the second position and delivering the cleaning liquid onto the outer surface of the rotary cup from the liquid delivery nozzle at the second position to perform a cleaning process on the rotary cup.

2. The liquid processing apparatus according to claim 1, wherein the apparatus further comprises a drain cup disposed around the rotary cup to receive a liquid discharged from the rotary cup and including a drain port configured to drain this liquid thus received.

3. The liquid processing apparatus according to claim 2, wherein the apparatus further comprises an exhaust cup disposed around the drain cup to mainly collect a gas component from inside and around the rotary cup.

4. The liquid processing apparatus according to claim 1, wherein the rotary cup includes an eaves portion inclined outward and downward and configured to cover an area above an end of the substrate held on the substrate holding member, and an outer wall portion connected to the eaves portion to surround the substrate, and wherein the cleaning liquid is supplied from above the eaves portion to perform the cleaning process.

5. The liquid processing apparatus according to claim 1, wherein the nozzle transfer mechanism swings the liquid delivery nozzle to move the liquid delivery nozzle to the first and second positions.

6. The liquid processing apparatus according to claim 1, wherein the substrate is held on the substrate holding member during the cleaning process on the rotary cup.

7. The liquid processing apparatus according to claim 1, wherein the sequence includes rotating the rotary cup along the substrate at as speed of 300 to 1,000 rpm during the liquid process on the substrate, and rotating the rotary cup at a speed of 100 to 300 rpm during the cleaning process on the rotary cup.

8. The liquid processing apparatus according to claim 4, wherein the apparatus further comprises a drain cup disposed around the rotary cup and an exhaust cup disposed around the drain cup such that the drain cup and the exhaust cup cooperate to cover areas above and around the eaves portion.

9. The liquid processing apparatus according to claim 8, wherein the exhaust cup includes an upper wall extending above the eaves portion and is configured to collect and exhaust gas through a gap between the upper wall and the eaves portion.

10. The liquid processing apparatus according to claim 1, wherein the liquid supply section is configured to supply a chemical and purified water selectively as the process liquid, and to supply purified water as the cleaning liquid.

* * * * *